(12) United States Patent
Lu et al.

(10) Patent No.: US 10,084,123 B2
(45) Date of Patent: Sep. 25, 2018

(54) PORTABLE LIGHT-EMITTING DEVICE WITHOUT PRE-STORED POWER SOURCES AND LED PACKAGE STRUCTURE THEREOF

(71) Applicant: HARVATEK CORPORATION, Hsinchu (TW)

(72) Inventors: Hsin I Lu, Hsinchu County (TW); Yu Ping Wang, Hsinchu (TW); Chia Pin Chang, Hsinchu (TW); Hui Yen Huang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 59 days.

(21) Appl. No.: 15/000,291

(22) Filed: Jan. 19, 2016

(65) Prior Publication Data
US 2017/0033270 A1 Feb. 2, 2017

(30) Foreign Application Priority Data
Jul. 31, 2015 (TW) .............................. 104124895 A

(51) Int. Cl.
*H01L 33/62* (2010.01)
*H01L 33/60* (2010.01)
(Continued)

(52) U.S. Cl.
CPC .............. *H01L 33/62* (2013.01); *A01K 93/00* (2013.01); *F21K 9/00* (2013.01); *H01L 25/165* (2013.01);
(Continued)

(58) Field of Classification Search
CPC ..... F21K 9/00; A01K 93/00; H01L 2924/181; H01L 2224/48091; H01L 2224/48137; H01L 2224/48247
See application file for complete search history.

(56) References Cited

U.S. PATENT DOCUMENTS 8,029,182 B2 * 10/2011 Chien ..................... F21S 8/035
362/101
2006/0062019 A1 * 3/2006 Young ..................... A47G 33/06
362/641
(Continued)

FOREIGN PATENT DOCUMENTS

CN          104701565 A      6/2015
JP          S5125510 Y       6/1976
(Continued)

*Primary Examiner* — Elmito Breval
(74) *Attorney, Agent, or Firm* — Li & Cai Intellectual Property (USA) Office

(57) ABSTRACT

An LED package structure without pre-stored power sources includes a substrate unit and a LED chip. The substrate unit includes a carrier substrate, a positive conductive pin, and a negative conductive pin. The positive conductive pin is made of a first predetermined material with positive oxidation-reduction potential. The negative conductive pin is made of a second predetermined material with negative oxidation-reduction potential. The LED chip is disposed on the carrier substrate and electrically connected between the positive conductive pin and the negative conductive pin. Both the positive conductive pin and the negative conductive pin concurrently contact a predetermined liquid for generating oxidation-reduction reaction so as to generate electric powers with a predetermined driving voltage, and the LED chip is driven by the electric powers with the predetermined driving voltage for generating an indicator light source. The instant disclosure further provides a portable light-emitting device without pre-stored power sources.

17 Claims, 7 Drawing Sheets

(51) Int. Cl.
*H01L 33/48* (2010.01)
*H01L 33/56* (2010.01)
*H01L 25/16* (2006.01)
*A01K 93/00* (2006.01)
*F21K 9/00* (2016.01)

(52) U.S. Cl.
CPC .......... *H01L 25/167* (2013.01); *H01L 33/483* (2013.01); *H01L 33/56* (2013.01); *H01L 33/60* (2013.01); *H01L 2224/48091* (2013.01); *H01L 2224/48137* (2013.01); *H01L 2224/48247* (2013.01); *H01L 2924/181* (2013.01)

(56) References Cited

U.S. PATENT DOCUMENTS

| | | | | |
|---|---|---|---|---|
| 2006/0118808 A1* | 6/2006 | Ishidu | ................... | H01L 33/642 257/100 |
| 2006/0164823 A1* | 7/2006 | Jao | ......................... | B44C 5/005 362/101 |
| 2009/0021180 A1* | 1/2009 | Underwood | ....... | H05B 33/0812 315/291 |
| 2009/0103286 A1* | 4/2009 | Yang | ...................... | A47G 19/24 362/101 |
| 2009/0133636 A1* | 5/2009 | Richmond | ........... | A01K 39/012 119/52.2 |
| 2009/0146173 A1* | 6/2009 | Jiang | ....................... | H01L 33/62 257/99 |
| 2009/0261374 A1* | 10/2009 | Hayashi | .................. | H01L 33/62 257/99 |
| 2012/0244765 A1* | 9/2012 | Huang | ...................... | B63C 9/11 441/89 |
| 2014/0084318 A1* | 3/2014 | Kim | ........................ | H01L 33/62 257/98 |
| 2014/0268660 A1* | 9/2014 | Yang | ....................... | F21S 8/035 362/101 |
| 2014/0332839 A1* | 11/2014 | Choi | ..................... | H01L 33/387 257/99 |
| 2015/0194585 A1* | 7/2015 | Kim | ........................ | H01L 33/62 257/99 |

FOREIGN PATENT DOCUMENTS

| | | |
|---|---|---|
| JP | S55117396 U | 8/1980 |
| JP | H05226699 A | 9/1993 |
| JP | H07335914 A | 12/1995 |
| JP | 2001111111 A | 4/2001 |
| JP | 2006019594 A | 1/2006 |
| JP | 2008205408 A | 9/2008 |
| JP | 2010533975 A | 10/2010 |
| TW | 201421773 A | 6/2014 |
| TW | 201440284 A | 10/2014 |

* cited by examiner

PORTABLE LIGHT-EMITTING DEVICE WITHOUT PRE-STORED POWER SOURCES AND LED PACKAGE STRUCTURE THEREOF

BACKGROUND OF THE INVENTION

1. Field of the Invention

The instant disclosure relates to a portable light-emitting device and a LED package structure thereof, and more particularly to a portable light-emitting device without pre-stored power sources and a LED package structure thereof.

2. Description of Related Art

LEDs are now widely used as illuminators, indicators or displays in many kinds of electronic products or industrial applications. One of the advantages of LEDs is that they consume much less electricity, or energy, as comparing with other traditional lighting devices. This is because the LEDs are known as solid state devices that generate light through a luminescence process. Thus, the light generated by LEDs is referred to "cold light". In addition, another advantage of LEDs is its small size. However, it is necessary for LEDs to use an internal power supply or an external power supply with pre-stored power sources so as to generate light source.

SUMMARY OF THE INVENTION

One aspect of the instant disclosure relates to a portable light-emitting device without pre-stored power sources and a LED package structure thereof.

One of the embodiments of the instant disclosure provides a LED package structure without pre-stored power sources, including: a substrate unit, a light-emitting unit, and a voltage booster chip. The substrate unit includes a carrier substrate, a positive conductive pin separated from the carrier substrate by a predetermined distance, and a negative conductive pin separated from the carrier substrate by a predetermined distance. The positive conductive pin is made of a first predetermined material with positive oxidation-reduction potential, and the negative conductive pin is made of a second predetermined material with negative oxidation-reduction potential. The light-emitting unit is disposed on the carrier substrate. The voltage booster chip is disposed on the carrier substrate and adjacent to the light-emitting unit, and the light-emitting unit and the voltage booster chip are electrically connected with each other.

In an embodiment, the first predetermined material with positive oxidation-reduction potential is selected from a group consisting of Al, Zn, Fe, and Ni, and the second predetermined material with negative oxidation-reduction potential is selected from a group consisting of Pb, Cu, Ag, Au, and Pt. Both the positive conductive pin and the negative conductive pin concurrently contact a predetermined liquid for generating oxidation-reduction reaction so as to generate electric powers with a predetermined initial voltage, the predetermined initial voltage of the electric powers is rectified and promoted into a predetermined driving voltage through the voltage booster chip, and the light-emitting unit is driven by the electric powers with the predetermined driving voltage for generating an indicator light source In an embodiment, the light-emitting unit includes a LED chip.

In an embodiment, the voltage booster chip is electrically connected between the positive conductive pin and the negative conductive pin through two first conductive wires, and the LED chip is electrically connected to the voltage booster chip through two second conductive wires.

In an embodiment, the LED package structure further comprises an opaque insulation frame and a light-transmitting package glue. The opaque insulation frame has an enclosing portion for enclosing one part of the carrier substrate, one part of the positive conductive pin, and one part of the negative conductive pin and an annular light-reflecting portion disposed on the enclosing portion to surround the LED chip and the voltage booster chip, and a receiving cavity surrounded by the annular light-reflecting portion is filled with the light-transmitting package glue for enclosing the LED chip and the voltage booster chip.

Another one of the embodiments of the instant disclosure provides a LED package structure without pre-stored power sources, comprising: a substrate unit and a LED chip. The substrate unit includes a carrier substrate, a positive conductive pin, and a negative conductive pin. The positive conductive pin is made of a first predetermined material with positive oxidation-reduction potential, and the negative conductive pin is made of a second predetermined material with negative oxidation-reduction potential. The LED chip is disposed on the carrier substrate and electrically connected between the positive conductive pin and the negative conductive pin.

In an embodiment, the first predetermined material with positive oxidation-reduction potential is selected from a group consisting of Al, Zn, Fe, and Ni, and the second predetermined material with negative oxidation-reduction potential is selected from a group consisting of Pb, Cu, Ag, Au, and Pt. Both the positive conductive pin and the negative conductive pin concurrently contact a predetermined liquid for generating oxidation-reduction reaction so as to generate electric powers with a predetermined driving voltage, and the LED chip is driven by the electric powers with the predetermined driving voltage for generating an indicator light source.

In an embodiment, the LED package structure further comprises an opaque insulation frame and a light-transmitting package glue. The opaque insulation frame has an enclosing portion for enclosing one part of the carrier substrate, one part of the positive conductive pin, and one part of the negative conductive pin and an annular light-reflecting portion disposed on the enclosing portion to surround the LED chip, and a receiving cavity surrounded by the annular light-reflecting portion is filled with the light-transmitting package glue for enclosing the LED chip.

Yet another one of the embodiments of the instant disclosure provides a portable light-emitting device without pre-stored power sources, comprising: a protection casing, a predetermined liquid, and a LED package structure. The protection casing has a first receiving space, a second receiving space, and an isolation element disposed between the first receiving space and the second receiving space. The predetermined liquid is received inside the first receiving space. The LED package structure is received inside the second receiving space, and the LED package structure comprises: a substrate unit and a light-emitting unit. The substrate unit includes a carrier substrate, a positive conductive pin separated from the carrier substrate by a predetermined distance, and a negative conductive pin separated from the carrier substrate by a predetermined distance. The positive conductive pin is made of a first predetermined material with positive oxidation-reduction potential, and the negative conductive pin is made of a second predetermined material with negative oxidation-reduction potential. The light-emitting unit is disposed on the carrier substrate.

In an embodiment, the portable light-emitting device further comprises a voltage booster chip, an opaque insulation frame, and a light-transmitting package glue. The voltage booster chip is disposed on the carrier substrate and adjacent to the light-emitting unit, and the light-emitting unit and the voltage booster chip are electrically connected in series or in parallel. The opaque insulation frame has an enclosing portion for enclosing one part of the carrier substrate, one part of the positive conductive pin, and one part of the negative conductive pin and an annular light-reflecting portion disposed on the enclosing portion to surround the light-emitting unit and the voltage booster chip, and a receiving cavity surrounded by the annular light-reflecting portion is filled with the light-transmitting package glue for enclosing the light-emitting unit and the voltage booster chip. When the isolation element is moved, the first receiving space and the second receiving space are in fluid communication with each other, so that the predetermined liquid flows from the first receiving space to the second receiving space. Both the positive conductive pin and the negative conductive pin concurrently contact a predetermined liquid for generating oxidation-reduction reaction so as to generate electric powers with a predetermined initial voltage, the predetermined initial voltage of the electric powers is rectified and promoted into a predetermined driving voltage through the voltage booster chip, and the light-emitting unit is driven by the electric powers with the predetermined driving voltage for generating an indicator light source.

Therefore, the LED chip of the light-emitting unit can be driven by the electric powers with the predetermined driving voltage for generating an indicator light source, due to the design of "both the positive conductive pin and the negative conductive pin concurrently contacting a predetermined liquid for generating oxidation-reduction reaction so as to generate electric powers with a predetermined initial voltage, and the predetermined initial voltage of the electric powers being rectified and promoted into a predetermined driving voltage through the voltage booster chip" or "both the positive conductive pin and the negative conductive pin concurrently contacting a predetermined liquid for generating oxidation-reduction reaction so as to generate electric powers with a predetermined driving voltage".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "a portable light-emitting device without pre-stored power sources and a LED package structure thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Figure 1:
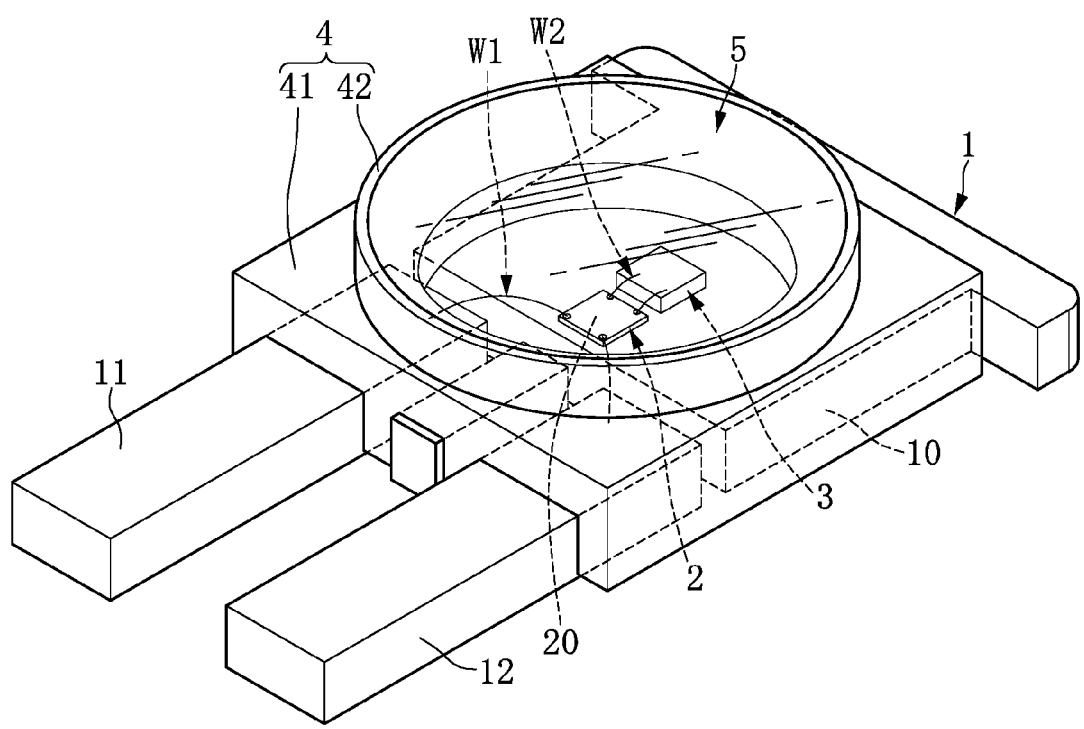
FIG. 1 shows a perspective, schematic view of the LED package structure without pre-stored power sources according to the instant disclosure.
Figure 2:
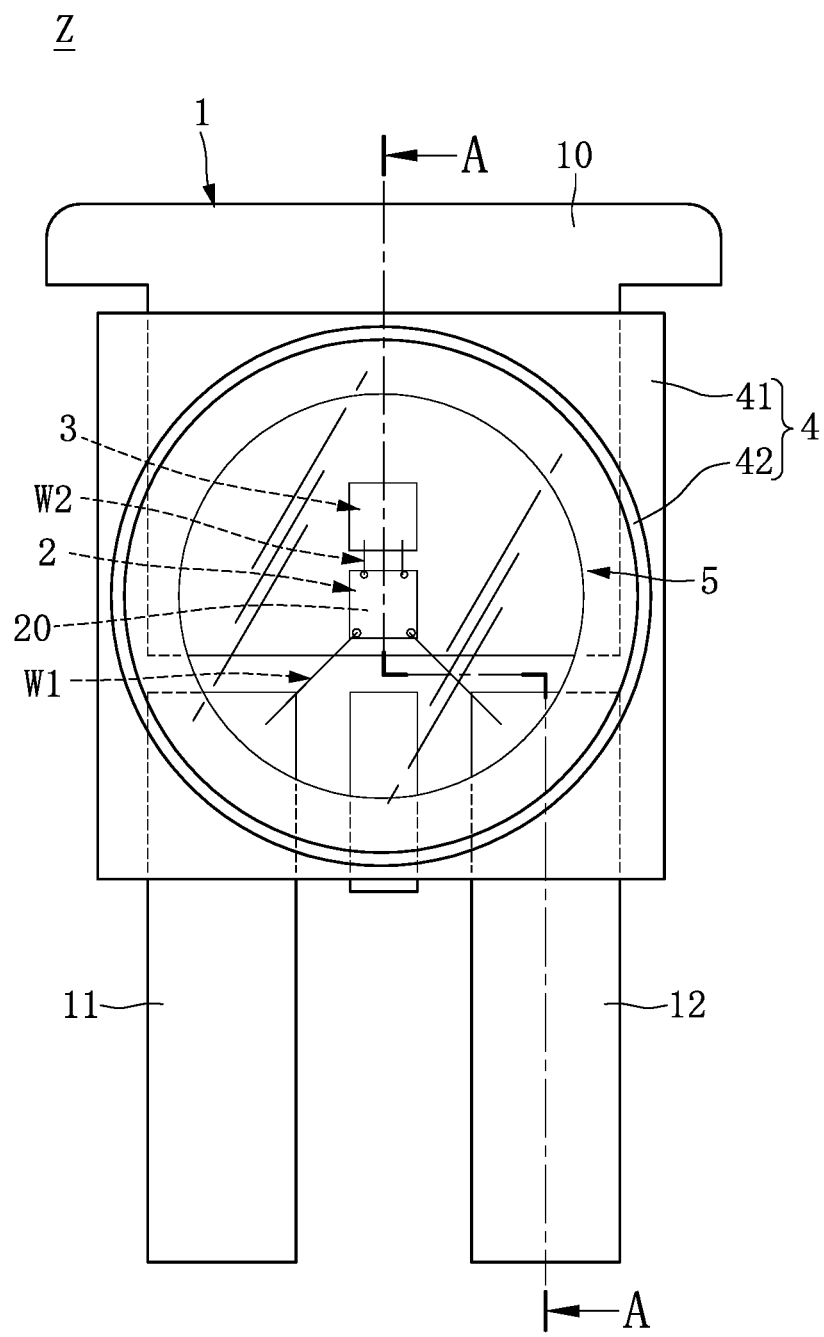
FIG. 2 shows a top, schematic view of the LED package structure without pre-stored power sources according to the instant disclosure.
Figure 3:
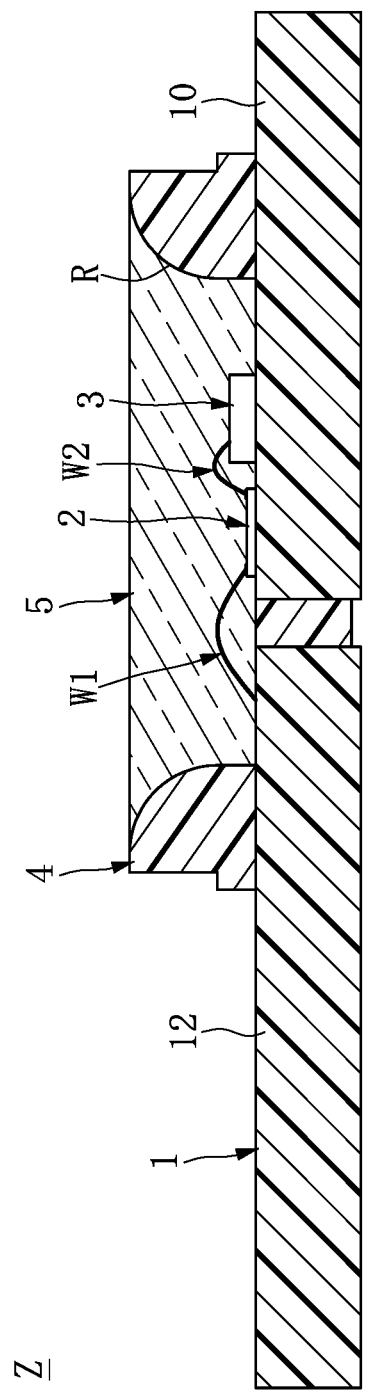
FIG. 3 shows a cross-sectional view taken along the section line A-A of FIG. 2.

Referring to FIG. 1 to FIG. 3, the instant disclosure provides a LED package structure Z without pre-stored power sources (such as any internal power supply or external power supply with pre-stored power sources), comprising: a substrate unit 1, a light-emitting unit 2, a voltage booster chip 3, an opaque insulation frame 4, and a light-transmitting package glue 5 (such as a glue body).

Referring to FIG. 1 and FIG. 2, the substrate unit 1 includes a carrier substrate 10, a positive conductive pin 11 separated from the carrier substrate 10 by a predetermined distance, and a negative conductive pin 12 separated from the carrier substrate 10 by a predetermined distance. For example, an optimal minimum distance between the positive conductive pin 11 and the negative conductive pin 12 may be about 0.1 mm, so as to achieve optimum oxidation-reduction reaction.

More particularly, the positive conductive pin 11 may be made of a first predetermined material with positive oxidation-reduction potential, and the negative conductive pin 12 may be made of a second predetermined material with negative oxidation-reduction potential. For example, the first predetermined material with positive oxidation-reduction potential may be one of Al, Zn, Fe, and Ni according to different requirements, and the second predetermined material with negative oxidation-reduction potential may be one of Pb, Cu, Ag, Au, and Pt according to different requirements, but these are merely an example and is not meant to limit the instant disclosure.

Following the above description, in another feasible embodiment, the negative conductive pin 12 may be integrated with the carrier substrate 10, and but the positive conductive pin 11 is also separated from the carrier substrate 10 by a predetermined distance. Otherwise, the positive conductive pin 11 may be integrated with the carrier substrate 10, and but the negative conductive pin 12 is also separated from the carrier substrate 10 by a predetermined distance. Hence, the above-mentioned design for the substrate unit 1 is merely an example and is not meant to limit the instant disclosure.

Moreover, referring to FIG. 1 to FIG. 3, the light-emitting unit 2 includes at least one LED chip 20 or a plurality of LED chips 20, and the light-emitting unit 2 including at least one LED chip 20 is used as an example for the following descriptions. In addition, the LED chip 20 is directly disposed on the carrier substrate 10, the voltage booster chip 3 is also disposed on the carrier substrate 10 and adjacent to the LED chip 20, and the LED chip 20 and the voltage booster chip 3 are electrically connected between the positive conductive pin 11 and the negative conductive pin 12 in series or in parallel.

For example, referring to FIG. 2 and FIG. 3, the LED chip 20 is electrically connected between the positive conductive pin 11 and the negative conductive pin 12 through two first conductive wires W1 by a wire-bonding method, and the voltage booster chip 3 is electrically connected to the LED chip 20 through two second conductive wires W2. Moreover, in another feasible embodiment, the position of the LED chip 20 and the position of the voltage booster chip 3 can be exchanged with each other, so that the voltage booster chip 3 is electrically connected between the positive conductive pin 11 and the negative conductive pin 12 through two first conductive wires W1, and the LED chip 20 is electrically connected to the voltage booster chip 3 through two second conductive wires W2. Please note, in yet another feasible embodiment, the LED chip 20 also can be electrically connected between the positive conductive pin 11 and the negative conductive pin 12 without two first conductive wires W1 by a flip-chip method. Hence, the above-mentioned electrical connection design for the LED chip 20 and the voltage booster chip 3 is merely an example and is not meant to limit the instant disclosure.

Furthermore, referring to FIG. 1 to FIG. 3, the opaque insulation frame 4 has an enclosing portion 41 (or an encapsulation portion) and an annular light-reflecting portion 42. One part of the carrier substrate 10, one part of the positive conductive pin 11, and one part of the negative conductive pin 12 are enclosed or encapsulated by the enclosing portion 41, so as to fix the distance among the carrier substrate 10, the positive conductive pin 11, and the negative conductive pin 12. The other part of the carrier substrate 10, the other part of the positive conductive pin 11, and the other part of the negative conductive pin 12 are exposed from the enclosing portion 41. In addition, the annular light-reflecting portion 42 is disposed on the enclosing portion 41 to surround the LED chip 20 and the voltage booster chip 3, and a receiving cavity R (as shown in FIG. 3) surrounded by the annular light-reflecting portion 42 is filled with the light-transmitting package glue 5 for enclosing the LED chip 20 and the voltage booster chip 3. For example, the opaque insulation frame 4 and the light-transmitting package glue 5 may be made of silicone or epoxy.

Therefore, when both the positive conductive pin 11 and the negative conductive pin 12 concurrently contact a predetermined liquid L (for example, ordinary water or electrolyte water such as seawater or rainwater) for generating oxidation-reduction reaction so as to generate electric powers with a predetermined initial voltage. In addition, the predetermined initial voltage of the electric powers is rectified and promoted into a predetermined driving voltage through the voltage booster chip 3, so that the LED chip 20 of the light-emitting unit 2 is driven by the electric powers with the predetermined driving voltage for generating an indicator light source.

For example, the instant disclosure may use Al as the first predetermined material with positive oxidation-reduction potential, use Cu as the second predetermined material with negative oxidation-reduction potential, and use a red LED for generating red light source as the LED chip 20 of the light-emitting unit 2. Therefore, when both the positive conductive pin 11 and the negative conductive pin 12 concurrently contact a predetermined liquid L (such as electrolyte water) for generating oxidation-reduction reaction so as to generate electric powers with 0.6 volts (V). Then, 0.6 volts provided by the electric powers is rectified and promoted into 1.8 volts through the voltage booster chip 3, so that the LED chip 20 of the light-emitting unit 2 is driven by the electric powers with 1.8 volts for generating a red indicator light source. However, that is merely an example and is not meant to limit the instant disclosure.

Figure 4:
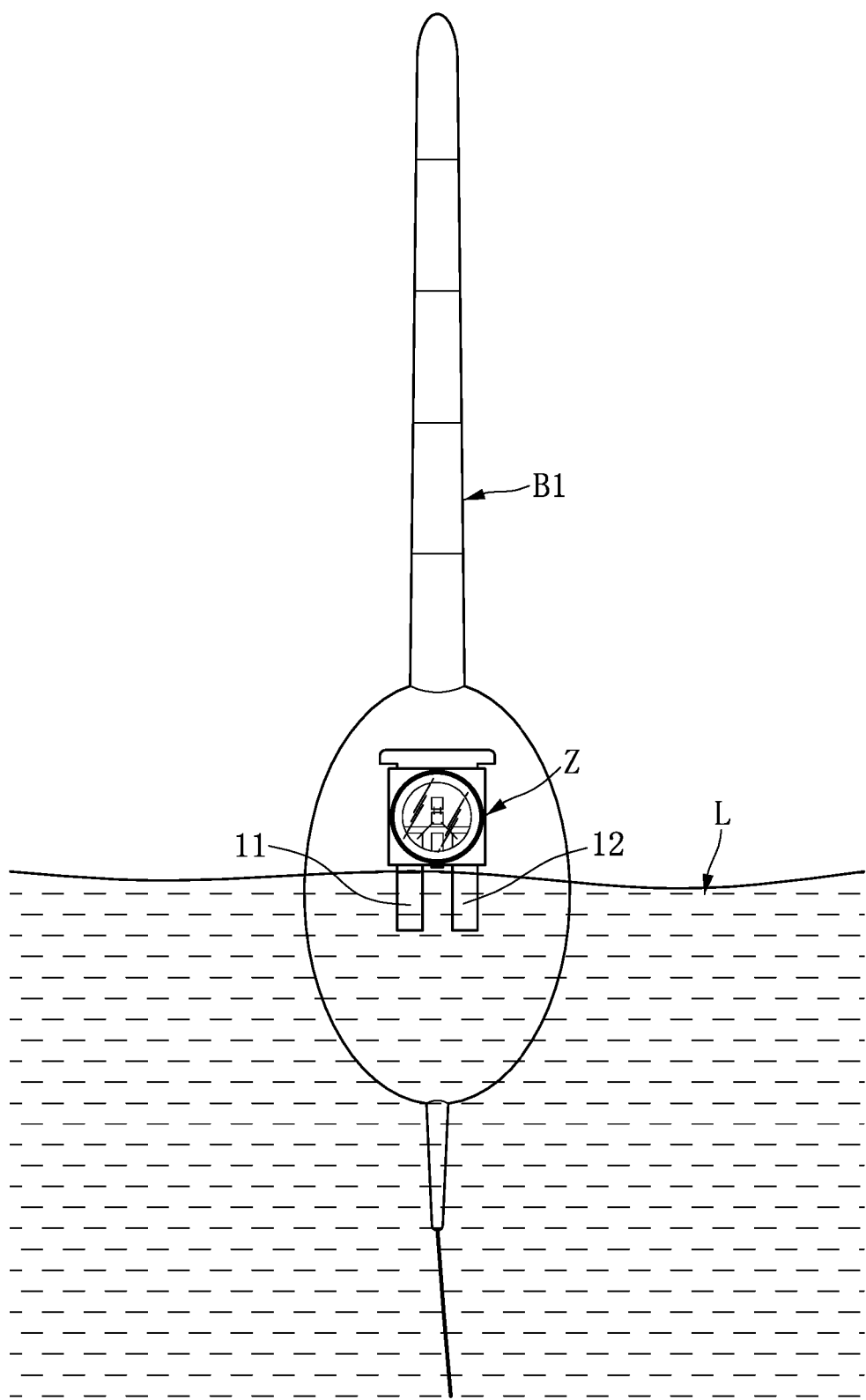
FIG. 4 shows a schematic view of the LED package structure without pre-stored power sources applied to a float according to the instant disclosure.
Figure 5:
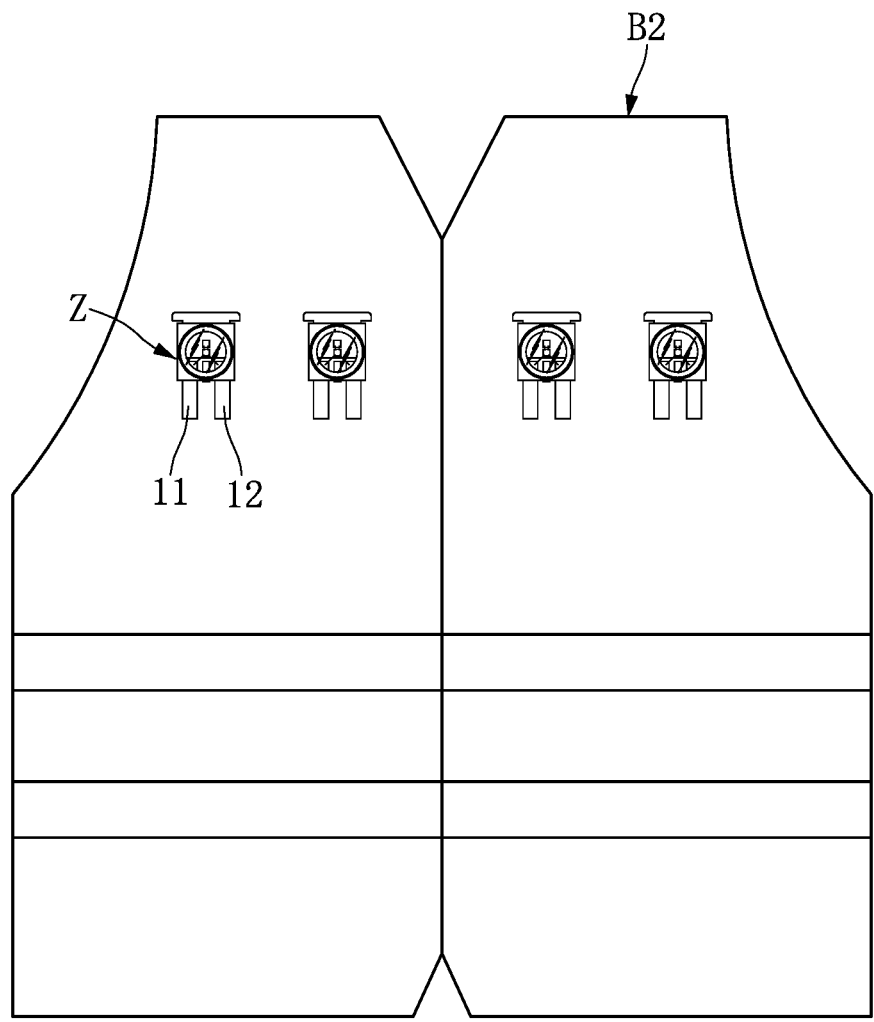
FIG. 5 shows a schematic view of the LED package structure without pre-stored power sources applied to a life saving jacket according to the instant disclosure.

Please note, the LED package structure Z of the instant disclosure can be applied to different objects according to different requirements. For example, the LED package structure Z may be applied to the float B1 (as shown in FIG. 4) or a life saving jacket B2 (as shown in FIG. 5).

Figure 6:
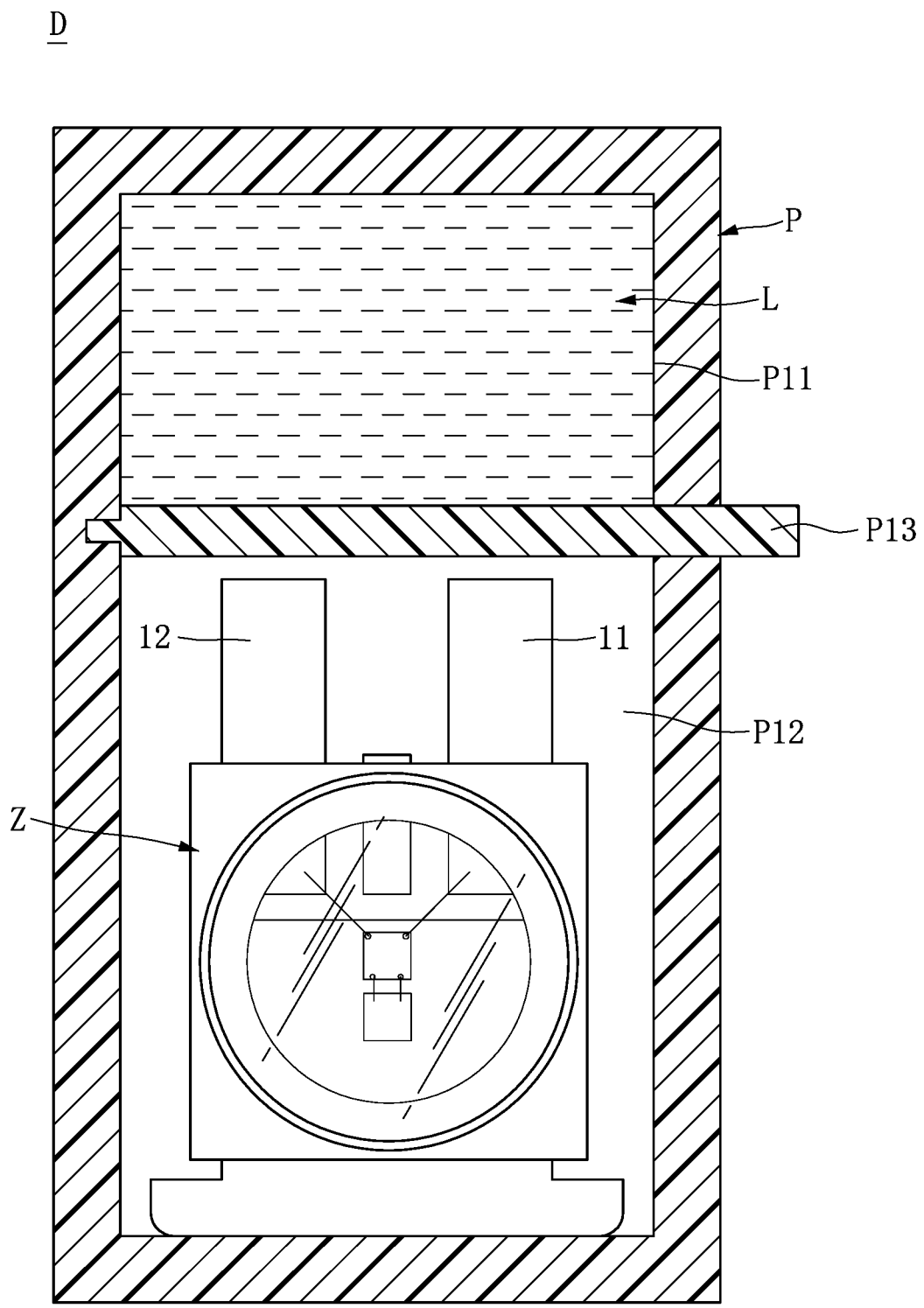
FIG. 6 shows a schematic view of before outwardly moving the isolation element of the portable light-emitting device without pre-stored power sources according to the instant disclosure.
Figure 7:
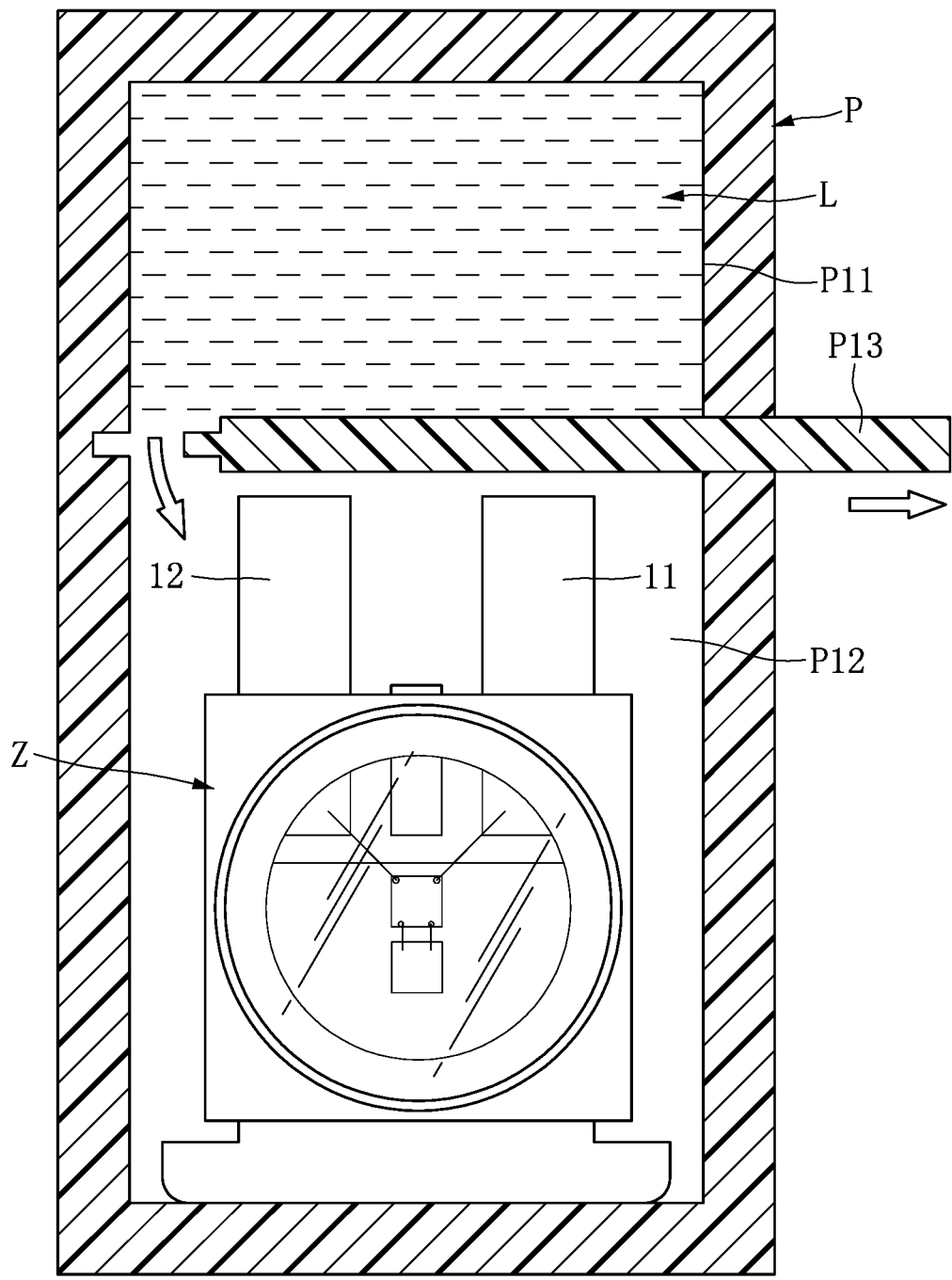
FIG. 7 shows a schematic view of after outwardly moving the isolation element of the portable light-emitting device without pre-stored power sources according to the instant disclosure.

Referring to FIG. 2, FIG. 6, and FIG. 7, the instant disclosure further provides a portable light-emitting device D without pre-stored power sources, comprising: a protection casing P, a predetermined liquid L, and a LED package structure Z. The protection casing Z has a first receiving space P11, a second receiving space P12, and an isolation element P13 disposed between the first receiving space P11 and the second receiving space P12. The predetermined liquid L is received inside the first receiving space P11. The LED package structure Z is received inside the second receiving space P12, and the LED package structure Z comprises a substrate unit 1, a light-emitting unit 2, a voltage booster chip 3, an opaque insulation frame 4, and a light-transmitting package glue 5.

Therefore, when the isolation element P13 is moved outwardly (as shown in FIG. 6), the first receiving space P11 and the second receiving space P12 are in fluid communication with each other, so that the predetermined liquid L can flow from the first receiving space P11 to the second receiving space P12. Hence, when both the positive conductive pin 11 and the negative conductive pin 12 concurrently contact a predetermined liquid L (for example, ordinary water or electrolyte water such as seawater or rainwater) for generating oxidation-reduction reaction so as to generate electric powers with a predetermined initial voltage. In addition, the predetermined initial voltage of the electric powers is rectified and promoted into a predetermined driving voltage through the voltage booster chip 3, so that the LED chip 20 of the light-emitting unit 2 is driven by the electric powers with the predetermined driving voltage for generating an indicator light source.

In conclusion, because the design of "both the positive conductive pin 11 and the negative conductive pin 12 concurrently contacting a predetermined liquid L for generating oxidation-reduction reaction so as to generate electric powers with a predetermined initial voltage, and the predetermined initial voltage of the electric powers being rectified and promoted into a predetermined driving voltage through the voltage booster chip 3" or "both the positive conductive pin 11 and the negative conductive pin 12 concurrently contacting a predetermined liquid L for generating oxidation-reduction reaction so as to generate electric powers with a predetermined driving voltage", so that the LED chip 20 of the light-emitting unit 2 can be driven by the electric powers with the predetermined driving voltage for generating an indicator light source.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An LED package structure without pre-stored power sources, comprising:
    a substrate unit comprising a carrier substrate, a positive conductive pin separated from the carrier substrate by a predetermined distance, and a negative conductive pin separated from the carrier substrate by a predetermined distance, wherein the positive conductive pin is made of a first predetermined material with positive oxidation-reduction potential, and the negative conductive pin is made of a second predetermined material with negative oxidation-reduction potential;
    a light-emitting unit disposed on the carrier substrate; and
    a voltage booster chip disposed on the carrier substrate and adjacent to the light-emitting unit, wherein the light-emitting unit and the voltage booster chip are electrically connected with each other;
    wherein the first predetermined material with positive oxidation-reduction potential is selected from a group consisting of Zn, Fe, and Ni;
    wherein the positive conductive pin and the negative conductive pin are, substantially, disposed in parallel with each other;
    wherein the light-emitting unit comprises an LED chip;
    wherein both the positive conductive pin and the negative conductive pin concurrently contact a predetermined liquid for generating an oxidation-reduction reaction so as to generate electric powers with a predetermined initial voltage, the predetermined initial voltage of the electric powers is rectified and promoted into a predetermined driving voltage through the voltage booster chip, and the light-emitting unit is driven by the electric powers with the predetermined driving voltage for generating an indicator light source.

2. The LED package structure of claim 1, wherein the second predetermined material with negative oxidation-reduction potential is selected from a group consisting of Pb, Cu, Ag, Au, and Pt.

3. The LED package structure of claim 1, wherein the voltage booster chip is electrically connected between the positive conductive pin and the negative conductive pin through two first conductive wires.

4. The LED package structure of claim 1, wherein the LED chip is electrically connected to the voltage booster chip through two second conductive wires.

5. The LED package structure of claim 1, further comprising an opaque insulation frame and a light-transmitting package glue.

6. The LED package structure of claim 5, wherein the opaque insulation frame has an enclosing portion for enclosing one part of the carrier substrate, one part of the positive conductive pin, and one part of the negative conductive pin and an annular light-reflecting portion disposed on the enclosing portion to surround the LED chip and the voltage booster chip, and a receiving cavity surrounded by the annular light-reflecting portion is filled with the light-transmitting package glue for enclosing the LED chip and the voltage booster chip.

7. An LED package structure without pre-stored power sources, comprising:
    a substrate unit comprising a carrier substrate, a positive conductive pin, and a negative conductive pin, wherein the positive conductive pin is made of a first predetermined material with positive oxidation-reduction potential, and the negative conductive pin is made of a second predetermined material with negative oxidation-reduction potential; and
    an LED chip disposed on the carrier substrate and electrically connected between the positive conductive pin and the negative conductive pin;
    wherein the first predetermined material with positive oxidation-reduction potential is selected from a group consisting of Zn, Fe, and Ni;
    wherein the positive conductive pin and the negative conductive pin are, substantially, disposed in parallel with each other;
    wherein both the positive conductive pin and the negative conductive pin concurrently contact a predetermined liquid for generating an oxidation-reduction reaction so as to generate electric powers with a predetermined driving voltage, and the LED chip is driven by the electric powers with the predetermined driving voltage for generating an indicator light source.

8. The LED package structure of claim 7, wherein the second predetermined material with negative oxidation-reduction potential is selected from a group consisting of Pb, Cu, Ag, Au, and Pt.

9. The LED package structure of claim 7, further comprising: an opaque insulation frame and a light-transmitting package glue.

10. The LED package structure of claim 9, wherein the opaque insulation frame has an enclosing portion for enclosing one part of the carrier substrate, one part of the positive conductive pin, and one part of the negative conductive pin and an annular light-reflecting portion disposed on the enclosing portion to surround the LED chip, and a receiving cavity surrounded by the annular light-reflecting portion is filled with the light-transmitting package glue for enclosing the LED chip.

11. The LED package structure of claim 7, wherein the predetermined liquid is ordinary water or electrolyte water.

12. A portable light-emitting device without pre-stored power sources, comprising:
    a protection casing having a first receiving space, a second receiving space, and an isolation element disposed between the first receiving space and the second receiving space;
    a predetermined liquid received inside the first receiving space; and
    a LED package structure received inside the second receiving space, wherein the LED package structure comprises:
    a substrate unit including a carrier substrate, a positive conductive pin separated from the carrier substrate by a predetermined distance, and a negative conductive pin separated from the carrier substrate by a predetermined distance, wherein the positive conductive pin is made of a first predetermined material with positive oxidation-reduction potential, and the negative conductive pin is made of a second predetermined material with negative oxidation-reduction potential; and
    a light-emitting unit disposed on the carrier substrate;

wherein the first predetermined material with positive oxidation-reduction potential is selected from a group consisting of Zn, Fe, and Ni;

wherein the positive conductive pin and the negative conductive pin are, substantially, disposed in parallel with each other;

wherein the light-emitting unit comprises an LED chip;

wherein when the isolation element is moved, the first receiving space and the second receiving space are in fluid communication with each other, so that the predetermined liquid flows from the first receiving space to the second receiving space, and wherein both the positive conductive pin and the negative conductive pin concurrently contact a predetermined liquid for generating an oxidation-reduction reaction so as to generate electric powers with a predetermined driving voltage, and the LED chip is driven by the electric powers with the predetermined driving voltage for generating an indicator light source.

13. The portable light-emitting device of claim 12, further comprising: a voltage booster chip, an opaque insulation frame, and a light-transmitting package glue.

14. The portable light-emitting device of claim 13, wherein the voltage booster chip is disposed on the carrier substrate and adjacent to the light-emitting unit, and the light-emitting unit and the voltage booster chip are electrically connected in series or in parallel.

15. The portable light-emitting device of claim 14, wherein the opaque insulation frame has an enclosing portion for enclosing one part of the carrier substrate, one part of the positive conductive pin, and one part of the negative conductive pin and an annular light-reflecting portion disposed on the enclosing portion to surround the light-emitting unit and the voltage booster chip, and a receiving cavity surrounded by the annular light-reflecting portion is filled with the light-transmitting package glue for enclosing the light-emitting unit and the voltage booster chip.

16. The portable light-emitting device of claim 12, wherein the predetermined initial voltage of the electric powers is rectified and promoted into a predetermined driving voltage through the voltage booster chip.

17. The LED package structure of claim 12, wherein the predetermined liquid is ordinary water or electrolyte water.

* * * * *